(12) United States Patent
Chiang

(10) Patent No.: US 6,366,105 B1
(45) Date of Patent: Apr. 2, 2002

(54) ELECTRICAL TEST APPARATUS WITH GAS PURGE

(75) Inventor: Wen-Huan Chiang, Chinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 08/844,686

(22) Filed: Apr. 21, 1997

(51) Int. Cl.[7] .............................................. G01R 31/02
(52) U.S. Cl. ....................................... 324/757; 324/765
(58) Field of Search ................................. 324/765, 760, 324/757; 438/14–18; 361/690, 700; 165/80.4; 257/48

(56) References Cited

U.S. PATENT DOCUMENTS

| | | | | |
|---|---|---|---|---|
| 3,710,251 A | * | 1/1973 | Hagge et al. ................ | 324/760 |
| 4,845,426 A | * | 7/1989 | Nolan et al. ................. | 324/760 |
| 4,870,355 A | * | 9/1989 | Kuffis et al. ................. | 324/760 |
| 4,872,356 A | | 10/1989 | Barnett et al. .............. | 73/866.5 |
| 5,034,688 A | * | 7/1991 | Moulene et al. ............ | 324/760 |
| 5,280,236 A | | 1/1994 | Takahashi et al. .......... | 324/158 |
| 5,415,042 A | | 5/1995 | Gray et al. .................... | 73/304 |

\* cited by examiner

*Primary Examiner*—Vinh P. Nguyen
(74) *Attorney, Agent, or Firm*—George O. Saile; Stephen B. Ackerman; Alek P. Szecsy

(57) ABSTRACT

A method for electrically testing an electrical circuit formed upon a substrate, and an apparatus employed within the method for electrically testing the electrical circuit formed upon the substrate. To practice the method, there is first provided a substrate having an electrical circuit formed thereupon. The substrate also has a conductor contact formed thereupon accessing the electrical circuit. The substrate is positioned within an electrical test apparatus, where the electrical test apparatus has a conductive probe tip fixed to the electrical test apparatus. The conductive probe tip is positioned in the proximity of but not in contact with the conductor contact. The conductive probe tip is then repositioned with respect to the substrate such that the conductive probe tip contacts the conductor contact while simultaneously purging the surface of the conductor contact with a purge gas stream. Finally, there is obtained an electrical measurement of the electrical circuit through the conductive probe tip in contact with the conductor contact while employing the electrical test apparatus.

14 Claims, 3 Drawing Sheets

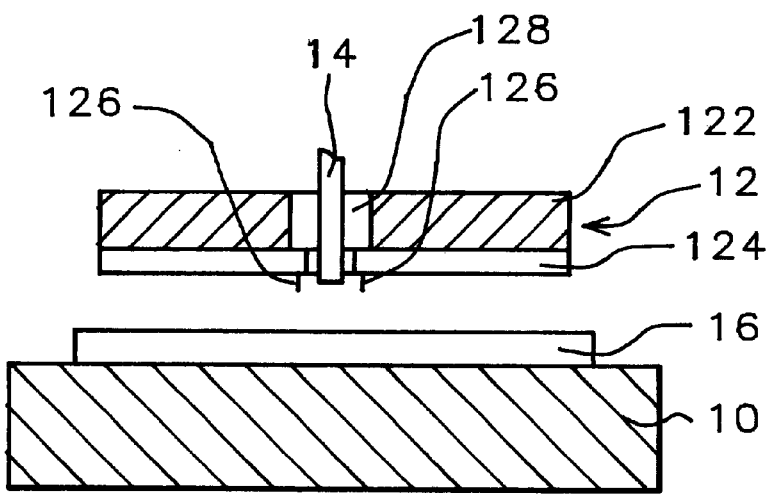
FIG. 1 – Prior Art
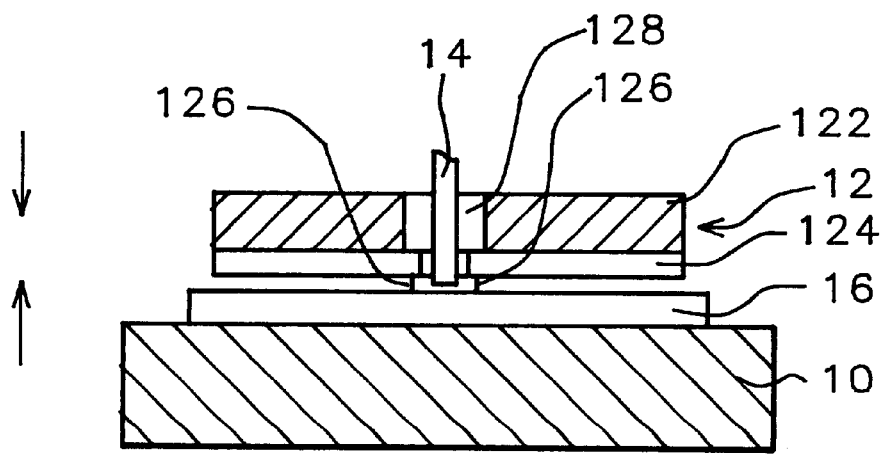
FIG. 2 – Prior Art

ELECTRICAL TEST APPARATUS WITH GAS PURGE

BACKGROUND OF THE INVENTION

1. Field of the Invention

The present invention relates generally to methods and apparatus for testing electrical circuits formed upon substrates such as but not limited to printed circuit substrates, ceramic substrates and semiconductor integrated circuit substrates. More particularly, the present invention relates to methods and apparatus for reliably testing electrical circuits formed upon substrates such as but not limited to printed circuit substrates, ceramic substrates and semiconductor integrated circuit substrates.

2. Description of the Related Art

Known in the arts of fabricating electrical circuits upon substrates such as but not limited to printed circuit substrates, ceramic substrates and semiconductor integrated circuit substrates is the use of electrical test apparatus, often in conjunction with the use of accelerated physical stress apparatus, to determine and/or assure the functionality and/or reliability of electrical circuits formed upon the substrates such as but not limited to the printed circuit substrates, the ceramic substrates and the semiconductor integrated circuit substrates. The use of electrical test apparatus, with or without the use of accelerated physical stress apparatus, may be employed at several process stages within electrical circuit fabrication, including but not limited to: (1) early electrical circuit fabrication process stages where the electrical test apparatus may be employed as an in-process test apparatus; and (2) later electrical circuit fabrication process stages where the electrical test apparatus may be employed as a final test apparatus and/or a product certification apparatus.

Electrical test apparatus employed in testing electrical circuits formed upon substrates such as but not limited to printed circuit substrates, ceramic substrates and semiconductor integrated circuit substrates typically provide direct physical contact to conductor contacts such as but not limited to bond pads which access upon the substrates electrical circuits whose electrical characteristics it is desired to test. The electrical test apparatus typically make physical contact with the conductor contacts through use of needle like tapered conductive probe tips which bridge from a probe card which forms a part of a tester head assembly within an electrical test apparatus to the conductor contacts which access the electrical circuits whose electrical characteristics it is desired to test. Conductive probe tips are typically configured within a probe card within a tester head assembly within an electrical test apparatus in a fashion such that they dissipate and distribute a loading pressure employed when contacting the conductive probe tips to the conductor contacts formed upon a substrate.

Shown in FIG. 1 and FIG. 2 is a pair of schematic cross-sectional diagrams illustrating operation of an electrical test apparatus conventional in the art of testing electrical circuits formed upon substrates such as but not limited to printed circuit substrates, ceramic substrates and semiconductor integrated circuit substrates. Shown in FIG. 1 is a platen 10 upon which is fixed a substrate 16 which may be chosen from the group of substrates including but not limited to printed circuit substrates, ceramic substrates and semiconductor integrated circuit substrates. Positioned in a first position adjoining but not in contact with the substrate 16 is a tester head assembly 12 which comprises a mounting block 122 having fixed thereupon a probe card 124 which in turn has disposed thereupon a minimum of one conductive probe tip 126 through which contact to a conductor contact (not shown) upon the substrate 16 is ultimately made. Also shown in FIG. 1 is an aperture 128 through the tester head assembly 12, which aperture 128 allows for access of a microscope 14 employed in assuring proper registration of the probe tips 126 with corresponding conductor contacts (not shown) formed upon the substrate 16. Shown in FIG. 2 is a schematic cross-sectional diagram illustrating the results of further processing of the substrate 16 within the electrical test apparatus as illustrated in FIG. 1. Shown in FIG. 2 is the results of repositioning the tester head assembly 12 from the first position with respect to the platen 10 as shown in FIG. 1 to a second position with respect to the platen 10 such that the conductive probe tips 126 contact the conductor contacts (not shown) within the substrate 16, thus allowing electrical measurements to be obtained of electrical circuits accessed through the conductor contacts (not shown) formed upon the substrate 10.

While the use within electrical test apparatus of conductive probe tips as contact elements bridging probe cards with conductor contacts formed upon substrates such as but not limited to printed circuit substrates, ceramic substrates and semiconductor integrated circuit substrates has become quite common in the art of testing electrical circuits formed upon substrates such as but not limited to printed circuit substrates, ceramic substrates and semiconductor integrated circuit substrates, the use within electrical test apparatus of conductive probe tips as contact elements bridging probe cards with conductor contacts formed upon substrates is not entirely without problems. In particular, it is known in the art that use of electrical test apparatus employing conductive probe tips as contact elements bridging probe cards with conductor contacts formed upon substrates suffers from several problems which relate to contact resistance increases between the conductive probe tips and the conductor contacts, including but not limited to: (1) conductive probe tip contact resistance increases due to conductive probe tip contact with adventitious non-conductive particulate deposited upon conductor contacts; (2) conductive probe tip contact resistance increases due to oxidation of conductor contact material which has transferred to a conductive probe tip; and (3) conductive probe tip contact resistance increases due to oxidation of conductive probe tip material when testing electrical circuits at elevated electrical test apparatus temperature. Such conductive probe tip contact resistance increases are undesirable since they may provide erroneous indications of non-functional or unreliable electrical circuits formed within substrates, thus erroneously reducing fabrication yields those substrates. It is thus towards providing: (1) an electrical test apparatus employing a conductive probe tip bridging to a conductor contact accessing an electrical circuit upon a substrate such as but not limited to a printed circuit substrate, a ceramic substrate or a semiconductor integrated circuit substrate; and (2) a method for employing the electrical test apparatus which employs the conductive probe tip bridging to the conductor contact accessing the electrical circuit upon the substrate, while avoiding the foregoing conductive probe tip contact resistance increases, that the present invention is directed.

The use of electrically conducting probes as a means for providing measurements within various technology applications, including but not limited to electrical circuit fabrication applications, is generally known within the various pertinent technology arts. For example, Gray et al., in U.S. Pat. No. 5,415,042 discloses a measuring probe for detecting the presence of an electrically conducting liquid or granular material contained within a vessel, The measuring probe employs a gas purge to clear the electrically conducting liquid or granular material from between the conducting electrodes of the measuring probe. In addition, Barnett et al., in U.S. Pat. No. 4,872,356 discloses a resistivity probe apparatus which provides an enclosure for a resistivity probe employed in monitoring resistivity of deionized water employed in rinsing semiconductor substrates employed within integrated circuit fabrication. The resistivity probe apparatus provides several advantages directed towards providing accurate and reproducible resistivity measurements from the resistivity probe housed within the resistivity probe apparatus.

Most pertinent to the present invention, however, is the disclosure of Takahashi et al. in U.S. Pat. No. 5,280,236. Takahashi et al. disclose an integrated circuit test apparatus comprising a probe card with conductive probe needles disposed on the probe card, where the conductive probe needles are formed of a cobalt based alloy comprising at least ten percent chromium. When properly polished or passivated, the conductive probe needles so formed are less susceptible to accumulating contaminants which increase contact resistance of the conductive probe needles when the conductive probe needles bridge to conductor contacts formed upon an integrated circuit substrate.

Desirable in the art are additional electrical test apparatus which employ conductive probe tips to bridge to conductor contacts which access electrical circuits formed upon substrates such as but not limited to printed circuit substrates, ceramic substrates and semiconductor integrated circuit substrates. Particularly desirable in the art are additional electrical test apparatus which employ conductive probe tips to bridge to conductor contacts which access electrical circuits formed upon substrates such as but not limited to printed circuit substrates, ceramic substrates and semiconductor integrated circuit substrates, while avoiding contact resistance increases of those conductive probe tips. It is towards providing an electrical test apparatus in accord with the foregoing goals, and a method for using the electrical test apparatus in accord with the foregoing goals, that the present invention is directed.

SUMMARY OF THE INVENTION

A first object of the present invention is to provide: (1) an electrical test apparatus which employs a conductive probe tip to bridge to a conductor contact which accesses an electrical circuit upon a substrate such as but not limited to a printed circuit substrate, a ceramic substrate and a semiconductor integrated circuit substrate; and (2) a method for using the electrical test apparatus to test the electrical circuit upon the substrate.

A second object of the present invention is to provide an electrical test apparatus and a method for using the electrical test apparatus in accord with the first object of the present invention, where there is avoided a contact resistance increase of the conductive probe tip which bridges to the conductor contact upon the substrate.

A third object of the present invention is to provide an electrical test apparatus and a method for using the electrical test apparatus in accord with the first object of the present invention and the second object of the present invention, where the electrical test apparatus and method for using the electrical test apparatus are readily manufacturable.

In accord with the objects of the present invention, there is provided by the present invention: (1) an electrical test apparatus employing a conductive probe tip to bridge to a conductor contact accessing an electrical circuit formed upon a substrate such as but not limited to a printed circuit substrate, a ceramic substrate and a semiconductor integrated circuit substrate; and (2) a method for using the electrical test apparatus when testing the electrical circuit formed upon the substrate. To practice the method of the present invention, there is first provided a substrate having an electrical circuit formed thereupon. The substrate also has a conductor contact formed thereupon which accesses the electrical circuit. The substrate is then positioned in a first position within an electrical test apparatus, where the electrical test apparatus has a conductive probe tip fixed within the electrical test apparatus. Within the first position, the conductive probe tip is positioned in the proximity of but not in contact with the conductor contact formed upon the substrate. The conductive probe tip is then repositioned to a second position with respect to the substrate such that the conductive probe tip contacts the conductor contact formed upon the substrate, while simultaneously purging the surface of the conductor contact with a purge gas stream. There is then obtained an electrical measurement of the electrical circuit within the substrate through the conductive probe tip in contact with the conductor contact while employing the electrical test apparatus. The method of the present invention also contemplates an electrical test apparatus through which the method of the present invention is practiced.

Through the present invention there is provided: (1) an electrical test apparatus; and (2) a method for using the electrical test apparatus, where the electrical test apparatus employs a conductive probe tip to bridge to a conductor contact which accesses an electrical circuit formed upon a substrate such as but not limited to a printed circuit substrate, a ceramic substrate and a semiconductor integrated circuit substrate, while avoiding a contact resistance increase of the conductive probe tip which bridges to the conductor contact formed upon the substrate. The electrical test apparatus and method of the present invention achieve the foregoing goals by employing a gas purge of the surface of the conductor contact simultaneous with repositioning the conductive probe tip from a first position in the proximity of but not contacting the conductor contact to a second position contacting the conductor contact.

The apparatus and method of the present invention are readily manufacturable. The apparatus and method of the present invention employ a gas purge upon the surface of a conductor contact formed upon a substrate, such as but not limited to a printed circuit substrate, a ceramic substrate and a semiconductor integrated circuit substrate, when a conductive probe tip is repositioned from a first position in the proximity of but not in contact with the conductor contact to a second position in contact with the conductor contact. Methods, materials and fabrications through which a purge gas flow may be introduced within an electrical test apparatus are, as illustrated within the preferred embodiment of the method and apparatus of the present invention, readily designed and constructed. Thus, the apparatus and method of the present invention are readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 and FIG. 2 show a pair of schematic cross-sectional diagrams illustrating progressive stages in electrical testing, while employing an electrical test apparatus conventional in the art, an electrical circuit formed upon a substrate such as but not limited to a printed circuit substrate, a ceramic substrate and a semiconductor integrated circuit substrate.

DESCRIPTION OF THE PREFERRED EMBODIMENT

The present invention provides: (1) an electrical test apparatus employing a conductive probe tip to contact a conductor contact which accesses an electrical circuit formed upon a substrate such as but not limited to a printed circuit substrate, a ceramic substrate and a semiconductor integrated circuit substrate; and (2) a method for using the electrical test apparatus employing the conductive probe tip for contacting the conductor contact which accesses the electrical circuit formed upon the substrate such as but not limited to the printed circuit substrate, the ceramic substrate and the semiconductor integrated circuit substrate, where there is avoided a contact resistance increase of the conductive probe tip. The electrical test apparatus and method of the present invention achieve these goals by employing a gas purge upon the surface of the conductor contact while simultaneously repositioning the conductive probe tip from a first position in the proximity of but not in contact with the conductor contact to a second position in contact with the conductor contact.

Figure 3:
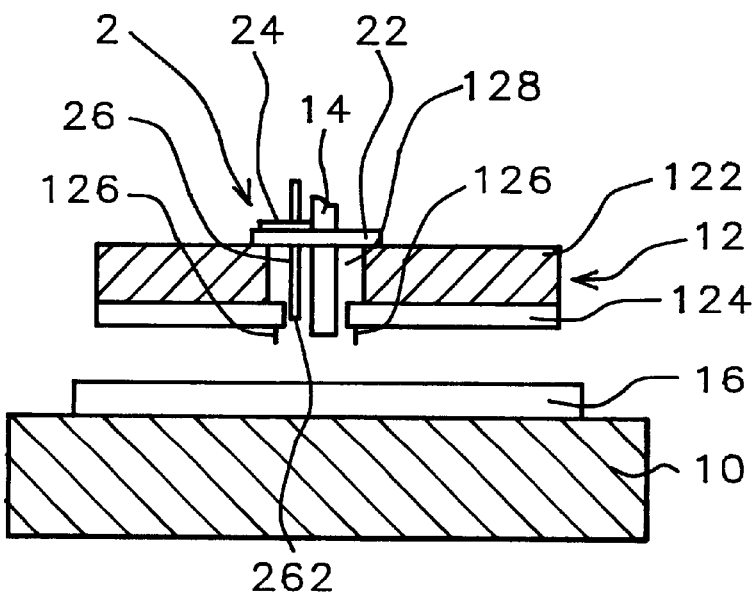
FIG. 3 and FIG. 4 show a pair of schematic cross-sectional diagrams illustrating progressive stages in electrical testing, while employing an electrical test apparatus in accord with the preferred embodiment of the present invention, an electrical circuit formed upon a substrate such as but not limited to a printed circuit substrate, a ceramic substrate and a semiconductor integrated circuit substrate.
Figure 4:
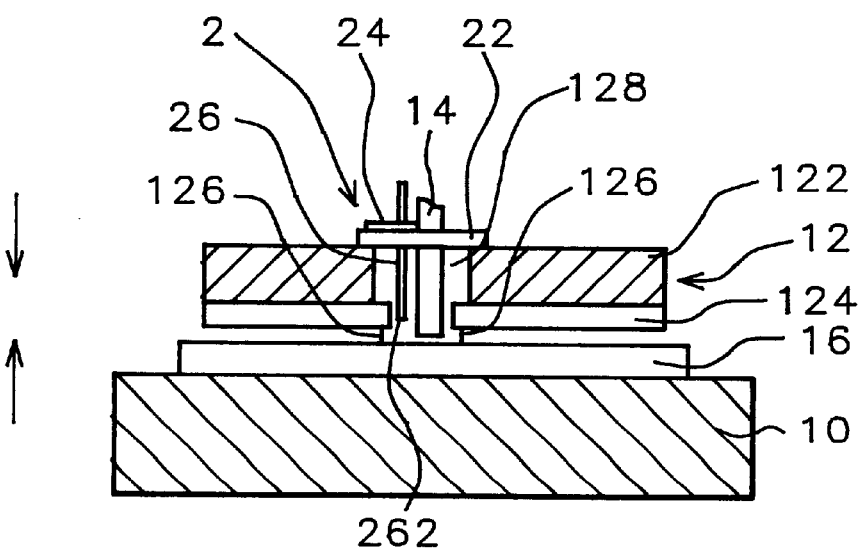

Referring now to FIG. 3 and FIG. 4, there is shown a pair of schematic cross-sectional diagrams illustrating progressive stages in operation of an electrical test apparatus constructed and operated in accord with the preferred embodiment of the electrical test apparatus and method of the present invention. Shown in FIG. 3 is a schematic cross-sectional diagram of the electrical test apparatus constructed in accord with the preferred embodiment of the present invention at an early stage in practice of the preferred embodiment of the method of the present invention.

Shown in FIG. 3 is a schematic cross-sectional diagram of an electrical test apparatus otherwise equivalent to the electrical test apparatus conventional in the art of electrical circuit testing, whose schematic cross-sectional diagram is illustrated in FIG. 1, but within which there is fabricated a purge gas assembly 2 comprising a support ring 22 having attached thereto a positioning member 24 which is employed in positioning within the aperture 128 a purge gas supply pipe 26 having at its end adjoining the conductive probe tips 126 a nozzle 262. Within FIG. 3, the substrate 16 upon the platen 10 is, similarly with FIG. 1, a substrate chosen from the group of substrates including but not limited to printed circuit substrates, ceramic substrates and semiconductor integrated circuit substrates. Within the preferred embodiment of the electrical test apparatus and method of the present invention, the substrate 16 is preferably a semiconductor integrated circuit substrate.

Also similarly with the electrical test apparatus whose schematic cross-sectional diagram is illustrated in FIG. 1, the platen 10 within the preferred embodiment of the electrical test apparatus of the present invention as illustrated in FIG. 3 is positioned in a first position with respect to the tester head assembly 12 such that the conductive probe tips 126 disposed upon the probe card 124 which in turn is affixed upon the mounting block 122 from which is in part formed the tester head assembly 12 are in the proximity of but not contacting corresponding conductor contacts (not shown) formed upon the substrate 16. While not specifically illustrated in either FIG. 1 or FIG. 3, the platen 10 and the tester head 12 within the electrical test apparatus are typically and preferably indirectly connected to allow for carefully controlled movement of the platen 10 with respect to the tester head 12.

Within the preferred embodiment of the electrical test apparatus and method of the present invention, typically and preferably, the conductive probe tips 126 are formed from tungsten or a tungsten alloy conductor material, although alternative conductor materials such as but not limited to beryllium-copper alloy, palladium and palladium alloy conductor materials may also be employed in forming the conductive probe tips 126. Typically and preferably, each of the conductive probe tips 126 has a contact area of about one-half the contact area of a conductor contact to which the conductive probe tip is to make contact.

Within the electrical test apparatus and method of the present invention, the conductor contact formed upon the substrate 16 may be formed from any of several conductor materials, including but not limited to aluminum, aluminum alloy, copper, copper alloy, tungsten, tungsten alloy, titanium, titanium alloy, lead, lead alloy, tin, tin alloy, antimony and antimony alloy conductor materials. Within the preferred embodiment of electrical test apparatus and method of the present invention, where the substrate 16 is a semiconductor integrated circuit substrate, the conductor contact will typically, although not exclusively, be formed of an aluminum alloy conductor material.

Referring now to FIG. 4, there is shown a schematic cross-sectional diagram illustrating the results of further processing of the substrate 16 within the preferred embodiment of the electrical test apparatus as illustrated in FIG. 3. Shown in FIG. 4 is the results of repositioning the platen 10 with respect to the tester head assembly 12 from its first position as illustrated in FIG. 3 to a second position as illustrated in FIG. 4, such that the conductive probe tips 126 contact the conductor contacts (not shown) formed upon the substrate 16, in order to test an electrical circuit formed upon the substrate 16. Although not specifically illustrated by the schematic cross-sectional diagram of FIG. 4, when the platen 10 is repositioned to the second position with respect to the tester head 12, there is simultaneously introduced a flow of purge gas through the purge gas supply pipe 26 and the nozzle 262 such that the surfaces of the conductor contacts within the substrate 16 are purged with the flow of purge gas. By employing the flow of purge gas through the purge gas supply pipe 26 and the nozzle 262 and purging the surfaces of the conductor contacts, there is avoided contact resistance increases of the conductive probe tips 126 when undertaking through the preferred embodiment of the electrical test apparatus and method of the present invention electrical measurements of electrical circuits formed upon the substrate 16.

Figure 5:
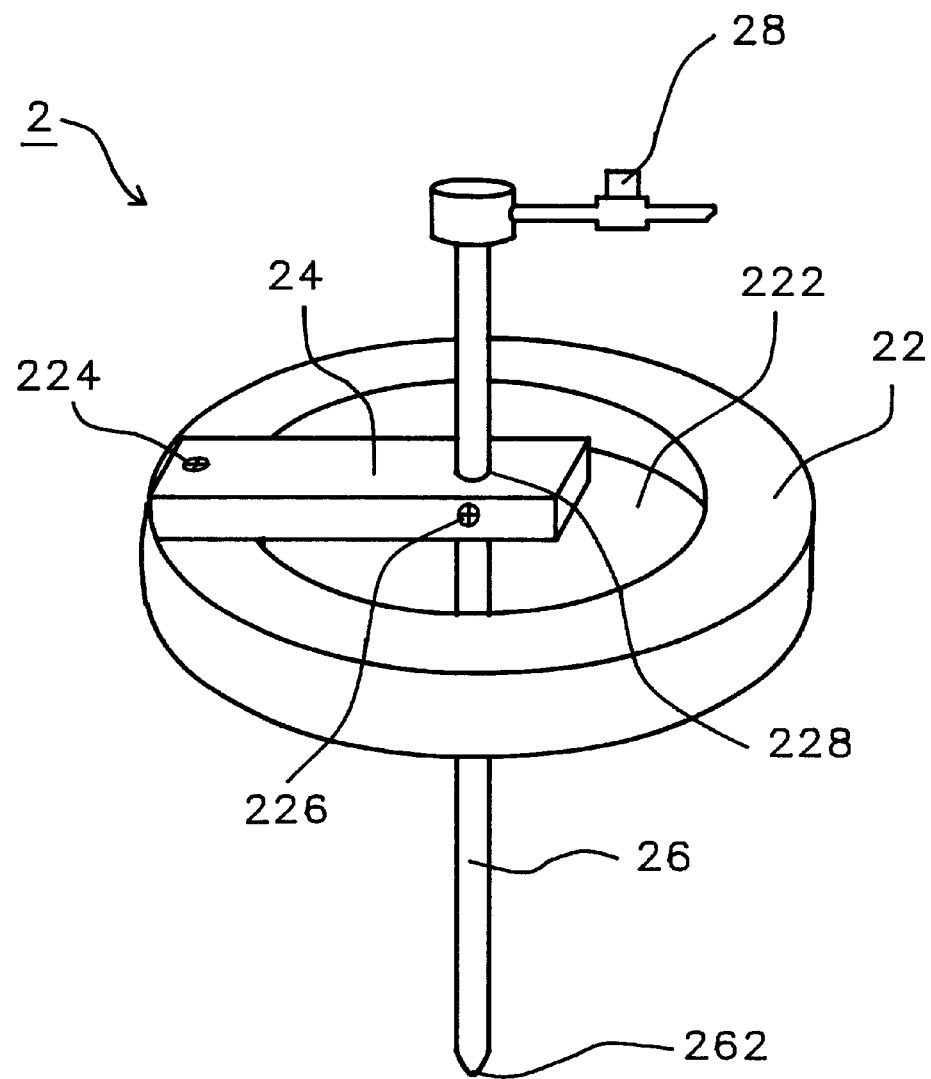
FIG. 5 shows a schematic perspective diagram illustrating a purge gas assembly employed within the preferred embodiment of the electrical test apparatus and method of the present invention.

Referring now to FIG. 5, there is shown a more complete perspective view diagram of the purge gas assembly 2 whose schematic cross-sectional diagram is illustrated in FIG. 3 and FIG. 4. Shown in FIG. 5 is the purge gas assembly 2 comprising the support ring 22 which defines a second aperture 222. Within the second aperture 222 there is positioned the purge gas supply pipe 26 having the nozzle 262 at one of its ends. The purge gas supply pipe 26 is positioned within the aperture 222 by means of the positioning member 24 which in turn has formed therein a third aperture 228 of size appropriate to accommodate the purge gas supply pipe 26. There is also contained within the positioning member 24 a horizontal adjust means 224 for adjusting the horizontal location of the nozzle 226 with respect to the conductive probe tips 126, and a vertical adjusting means 226 for adjusting the vertical position of the nozzle 226 with respect to the conductive probe tips 126. Finally, there is shown attached to the end of the purge gas supply 26 opposite the nozzle 262 a purge gas supply valve 28 which may be employed to control the pressure and flow of purge gas through the purge gas supply pipe 26 and the nozzle 262.

When employing the purge gas assembly 2 in accord with the preferred embodiment of the apparatus and method of the present invention, the purge gas is preferably nitrogen, although other inert purge gases may also be employed, including but not limited to air, argon and helium purge gases. When employing the preferred embodiment of the electrical test apparatus and method of the present invention at an elevated substrate temperature and elevated electrical test apparatus temperature, a non-oxidizing inert purge gas (ie: a non-oxygen containing purge gas) is preferred. Preferably the purge gas is filtered to exclude particles of size greater than about 10 microns. Within the preferred embodiment of the method and apparatus of the present invention, the nozzle 262 preferably has an aperture having a diameter of from about 1 to about 2 millimeters and the purge gas flow through the nozzle 262 is preferably from about 85000 to about 90000 standard cubic centimeters per minute (sccm) of purge gas. Preferably, the distance of the conductive probe tips 126 from the nozzle 262 is from about 40 to about 70 millimeters.

EXAMPLE

A purge gas assembly was constructed in accord with the purge gas assembly 2 as illustrated in FIG. 5. The purge gas assembly employed a nozzle having an aperture of diameter about 2 millimeters. The purge gas assembly was fabricated into an electrical test apparatus to form an electrical test apparatus in accord with the preferred embodiment of the electrical test apparatus of the present invention whose schematic cross-sectional diagram is illustrated in FIG. 3 and FIG. 4. The electrical test apparatus in turn was employed to test electrical circuits formed upon semiconductor integrated circuit chips within semiconductor integrated circuit substrates within a manufacturing environment. Within the electrical test apparatus, there was employed a series of conductive probe tips disposed upon a probe card, such as the conductive probe tips 126 disposed upon the probe card 124 as illustrated in FIG. 1 to FIG. 4, where the conductive probe tips were formed of tungsten. The conductive probe tips had a maximum separation distance from the nozzle within the purge gas assembly of about 70 millimeters. Similarly with the semiconductor integrated circuit substrates within the preferred embodiment of the method of the present invention, the semiconductor integrated circuit chips within the semiconductor integrated circuit substrates had formed thereupon conductor contacts of an aluminum-copper alloy, where the conductor contacts accessed electrical circuits within the semiconductor integrated circuit chips.

The electrical circuits within a series of 10000 semiconductor integrated circuit chips were tested using the electrical test apparatus having fabricated therein the purge gas assembly while employing a nitrogen gas purge at a purge gas flow rate of about 85000 standard cubic centimeters per minute (sccm). There was measured for the series of 10000 semiconductor integrated circuit chips the resistance of an electrical circuit formed therein whose design resistance was 1 ohm. For comparison purposes, there was measured for an equivalent series of 10000 semiconductor integrated circuit chips the resistance of an equivalent electrical circuit formed therein whose design resistance was 1 ohm, in the absence of a nitrogen purge gas flow. From the measured resistances of the two separate series of 10000 electrical circuits within the two series of 10000 semiconductor integrated circuit chips, as measured with and without the nitrogen purge gas flow, there was determined the average resistances of the electrical circuits for three groups of 1000 integrated circuit chips, the three groups of 1000 integrated circuit chips being taken from the beginning, middle and end of the group of 10000 integrated circuit chips. The average measured values of the electrical circuit resistances for the electrical circuits formed upon the three groups of 1000 integrated circuit chips is reported in Table I.

TABLE 1

| | Average Electrical Circuit Resistance (ohms) | |
|---|---|---|
| S/C I/C Chip Numbers | With N2 Purge | Without N2 Purge |
| 1–1000 | 1 | 1 |
| 4500–5500 | 1.5 | 2.5 |
| 9000–10000 | 2 | 4 |

As is seen from review of the data in Table I, the resistance measurements of the electrical circuits within the series of 10000 semiconductor integrated circuit chips whose conductor contacts were purged with a nitrogen purge gas were lower and more uniform than the otherwise equivalent series of resistance measurements obtained for the otherwise equivalent series electrical circuits within the otherwise equivalent series semiconductor integrated circuit chips in the absence of the nitrogen gas purge. Thus, it is seen that through the electrical test apparatus and method of the present invention conductive probe tips which bridge to conductor contacts accessing electrical circuits within substrates such as but not limited to printed circuit substrates, ceramic substrates and semiconductor integrated circuit substrates may be employed in obtaining electrical measurements of those electrical circuits while avoiding contact resistance increases of the conductive probe tips.

As is understood by a person skilled in the art, the preferred embodiment and example of the present invention are illustrative of the present invention rather than limiting of the present invention. Revisions and modifications may be made to methods, materials structures and dimensions through which is provided the preferred embodiment of the electrical test apparatus and method of the present invention while still providing an electrical test apparatus and method in accord with the spirit and scope of the present invention, as defined by the appended claims.

What is claimed is:

1. A method for testing an electrical circuit formed upon a substrate comprising:

providing a substrate having an electrical circuit formed upon the substrate, the electrical circuit being accessed by a conductor contact also formed upon the substrate;

positioning the substrate within an electrical test apparatus, the electrical test apparatus having a conductive probe tip fixed to the electrical test apparatus, the conductive probe tip being positioned in a first position in the proximity of but not in contact with the conductor contact;

repositioning the conductive probe tip to a second position with respect to the substrate such that the conductive probe tip contacts the conductor contact while simultaneously purging the surface of the conductor contact with a purge gas stream; and obtaining an electrical measurement of the electrical circuit through the conductive probe tip in contact with the conductor contact while employing the electrical test apparatus, wherein the purging of the surface of the conductor contact with the purge gas stream is undertaken employing conditions such that when repositioning the conductive probe tip to the second position with respect to the substrate there is avoided a contact resistance increase of the conductive probe tip with respect to the conductor contact when contacting the conductor contact;

wherein the purge gas stream is provided through a nozzle;

the nozzle has an aperture having a diameter of from about 1 to about 2 millimeters; the nozzle is separated from the conductive probe tip by a distance of from about 40 to about 70 millimeters; and the purge gas stream has a purge gas flow rate of from about 85000 to about 90000 standard cubic centimeters per minute (sccm).

2. The method of claim 1 wherein the substrate is chosen from the group of substrates consisting of printed circuit substrates, ceramic substrates and semiconductor integrated circuit substrates.

3. The method of claim 1 wherein the conductive probe tip is formed from a conductor material chosen from the group of conductor materials consisting of tungsten, beryllium-copper alloy, palladium and palladium alloy conductor materials.

4. The method of claim 1 wherein the conductor contact is formed from a conductor material chosen from the group of conductor materials consisting of aluminum, aluminum alloy, copper, copper alloy, tungsten, tungsten alloy, titanium, titanium alloy, lead, lead alloy, tin, tin alloy, antimony and antimony alloy conductor materials.

5. A method for electrically testing an integrated circuit comprising:

providing a semiconductor integrated circuit substrate having an integrated circuit formed thereupon, the integrated circuit being accessed by a conductor contact also formed upon the semiconductor integrated circuit substrate;

positioning the semiconductor integrated circuit substrate within an electrical test apparatus, the electrical test apparatus having a conductive probe tip fixed to the electrical test apparatus, the conductive probe tip being positioned in a first position in the proximity of but not in contact with the conductor contact;

repositioning the conductive probe tip with respect to the semiconductor substrate to a second position such that the conductive probe tip contacts the conductor contact while simultaneously purging the surface of the conductor contact with a purge gas stream; and obtaining an electrical measurement of the integrated circuit through the conductive probe tip in contact with the conductor contact while employing the electrical test apparatus, wherein the purging of the surface of the conductor contact with the purge gas stream is undertaken employing conditions such that when repositioning the conductive probe tip to the second position with respect to the semiconductor substrate there is avoided a contact resistance increase of the conductive probe tip with respect to the conductor contact when contacting the conductor contact;

where in the purge gas stream is provided through a nozzle;

the nozzle has an aperture having a diameter of from about 1 to about 2 millimeters; the nozzle is separated from the conductive probe tip by a distance of from about 40 to about 70 millimeters; and the purge gas stream has a purge gas flow rate of from about 85000 to about 90000 standard cubic centimeters per minute (sccm).

6. The method of claim 5 wherein the conductive probe tip is formed from a conductive material chosen from the group of conductive materials consisting of tungsten, beryllium-copper alloy, palladium and palladium alloy conductive materials.

7. The method of claim 5 wherein the conductor contact is formed from a conductive material chosen from the group of conductive materials consisting of aluminum, aluminum alloy, copper, copper alloy, tungsten, tungsten alloy, titanium, titanium alloy, lead, lead alloy, tin, tin alloy, antimony and antimony alloy conductive materials.

8. An electrical test apparatus for electrically testing an electrical circuit formed upon a substrate comprising:

a platen sized to fixture a substrate upon the platen, the substrate having an electrical circuit formed upon the substrate, the substrate also having a conductor contact formed upon the substrate, where the conductor contact accesses the electrical circuit;

a conductive probe tip fixed indirectly to the platen, the conductive probe tip being capable of being positioned in a first position in the proximity of but not in contact with the conductor contact formed upon the substrate when the substrate is fixed upon the platen, the conductive probe tip also being capable of being repositioned in a second position in contact with the conductor contact formed upon the substrate when the substrate is fixed upon the platen; and a nozzle for supplying a purge gas stream onto the surface of the conductor contact formed upon the substrate when the conductive probe tip is repositioned from the first position to the second position wherein:

the nozzle has an aperture having a diameter of from about 1 to about 2 millimeters;

the nozzle is separated from the conductive probe tip by a distance of from about 40 to about 70 millimeters; and the purge gas stream has a purge gas flow rate of from about 85000 to about 90000 standard cubic centimeters per minute (sccm).

9. The electrical test apparatus of claim 8 wherein the substrate is chosen from the group of substrates consisting of printed circuit substrates, ceramic substrates and semiconductor integrated circuit substrates.

10. The electrical test apparatus of claim 8 wherein the conductive probe tip is formed from a conductor material chosen from the group of conductor materials consisting of tungsten, beryllium-copper alloy, palladium and palladium alloy conductor materials.

11. The electrical test apparatus claim 8 wherein the conductor contact is formed from a conductor material chosen from the group of conductor materials consisting of aluminum, aluminum alloy, copper, copper alloy, tungsten, tungsten alloy, titanium, titanium alloy, lead, lead alloy, tin, tin alloy, antimony and antimony alloy conductor materials.

12. An electrical test apparatus for electrically testing an integrated circuit formed upon a semiconductor integrated circuit substrate comprising:

a platen sized to fixture a semiconductor integrated circuit substrate upon the platen, the semiconductor integrated circuit substrate having an integrated circuit formed thereupon, the semiconductor integrated circuit substrate also having a conductor contact formed upon the semiconductor integrated circuit substrate, the conductor contact accessing the integrated circuit;

a conductive probe tip fixed indirectly to the platen, the conductive probe tip being capable of being positioned in a first position in the proximity of but not in contact with the conductor contact formed upon the semiconductor integrated circuit substrate when the semiconductor integrated circuit substrate is fixed upon the platen, the conductive probe tip also being capable of being repositioned in a second position in contact with the conductor contact formed upon the semiconductor integrated circuit substrate when the semiconductor integrated circuit substrate is fixed upon the platen; and a nozzle for supplying a purge gas stream to the surface of the conductor contact formed upon the semiconductor integrated circuit substrate when the semiconductor integrated circuit substrate is repositioned from the first position to the second position, wherein:

the nozzle has an aperture having a diameter of from about 1 to about 2 millimeters;

the nozzle is separated from the conductive probe tip by a distance of from about 40 to about 70 millimeters; and the purge gas stream has a purge gas flow of from about 85000 to about 90000 standard cubic centimeters per minute (sccm).

13. The electrical test apparatus of claim 12 wherein the conductive probe tip is formed from a conductor material chosen from the group of conductor materials consisting of tungsten, beryllium-copper alloy, palladium and palladium alloy conductor materials.

14. The electrical test apparatus claim 12 wherein the conductor contact is formed from a conductor material chosen from the group of conductor materials consisting of aluminum, aluminum alloy, copper, copper alloy, tungsten, tungsten alloy, titanium, titanium alloy, lead, lead alloy, tin, tin alloy, antimony and antimony alloy conductor materials.

* * * * *